United States Patent [19]

Dudley et al.

[11] 3,881,245

[45] May 6, 1975

[54] MOUNTING ELECTRICAL COMPONENTS ON THICK FILM PRINTED CIRCUIT ELEMENTS

[75] Inventors: Jeffrey Leoman Dudley, Solihull; John Christopher Walker, Nuneaton, both of England

[73] Assignee: Lucas Aerospace Limited, Birmingham, England

[22] Filed: Feb. 26, 1974

[21] Appl. No.: 445,853

[30] Foreign Application Priority Data

Mar. 13, 1973 United Kingdom.............. 12041/73

[52] U.S. Cl. .................. 29/627; 29/626; 174/68.5; 317/101 C; 317/101 CC

[51] Int. Cl. ............................................ H05k 3/32

[58] Field of Search ....... 29/626, 627, 470.7, 471.1, 29/475, 479, 480; 174/68.5, 52 PE, 59; 317/101 C, 101 CC, 101 DH; 264/272; 219/56, 58, 117 R, 119, 162

[56] References Cited

UNITED STATES PATENTS

| | | | |
|---|---|---|---|
| 2,898,519 | 8/1959 | Foster | 317/101 CC UX |
| 3,141,998 | 7/1964 | Silkman | 29/626 X |
| 3,200,020 | 8/1965 | Schroeder | 174/68.5 X |
| 3,290,557 | 12/1966 | Ayer | 174/68.5 |
| 3,353,263 | 11/1967 | Helms | 29/471.1 |
| 3,437,882 | 4/1969 | Cayzer | 317/101 CC X |
| 3,469,148 | 9/1969 | Lund | 29/627 X |
| 3,546,539 | 12/1970 | Wilcox et al | 174/68.5 |
| 3,693,252 | 9/1972 | Robertson et al. | 29/627 |
| 3,704,515 | 12/1972 | Nelson | 29/626 |

*Primary Examiner*—C. W. Lanham
*Assistant Examiner*—Joseph A. Walkowski
*Attorney, Agent, or Firm*—Cushman, Darby & Cushman

[57] ABSTRACT

A method of mounting, on a thick film printed circuit, a component having metallised ends, includes welding strips of metal foil to appropriate conductive areas of the circuit, placing the component with its metallised ends overlaying the strips, wrapping the strips around the metallised ends and welding the strips in place on the ends. The component may additionally be adhesively secured to the circuit and may be encapsulated after being mounted.

9 Claims, 4 Drawing Figures

MOUNTING ELECTRICAL COMPONENTS ON THICK FILM PRINTED CIRCUIT ELEMENTS

This invention relates to the mounting of electrical components on thick film printed circuit elements. The term "thick film printed circuit elements" is used herein to mean a pattern of conductive areas produced on a refractory insulating substrate by printing the pattern in an ink containing metal powder and firing the substrate to harden the ink.

It is generally recommended that components having metallised areas should be mounted on such circuit elements by soldering, the solder performing the function of both securing the component in position and electrically connecting it to the circuit element. It is found however, that soldering is not satisfactory since solder can spill over on to adjacent conductive areas. In addition the strength of a connection formed in this way is not always satisfactory particularly if the circuit is to be used in an environment where it is subjected to high temperatures and thermal cycling between high and sub-zero temperatures (e.g. −40° to +130°C).

Alternatively the metallised areas of the components are secured to the circuit elements by means of conductive epoxy-resin based adhesive. This alternative method of mounting is likewise liable to fail after thermal cycling, as a result of differential thermal expansion between the component, the circuit elements and the adhesives.

Accordingly it is an object of the invention to provide a method of mounting an electrical component on a thick film printed circuit element in which these disadvantages are avoided.

A method in accordance with the invention comprises welding a strip of metal foil to a conductive area of the circuit element, placing the component on this conductive area, wrapping the ends of the strip around the component and welding them to a metallised area on the component.

An example of the invention is illustrated in the accompanying drawings in which FIGS. 1 to 4 are fragmentary elevations of a circuit element showing four successive stages in attaching a component thereto.

In the example described the component is a chip capacitor 10 having metallised ends 11, 12. The component may be as small as 0.10 inch × 0.10 inch. The circuit element to which it is to be applied consists of a ceramic substrate 13 with printed areas 14 of metallic ink, fired to harden and fuse the metal powder in the ink.

Figure 1:
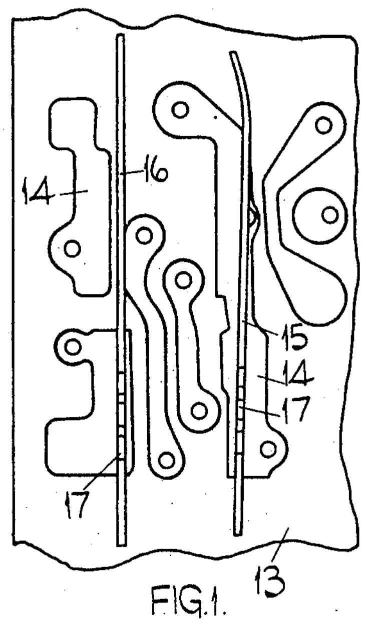
Figure 2:
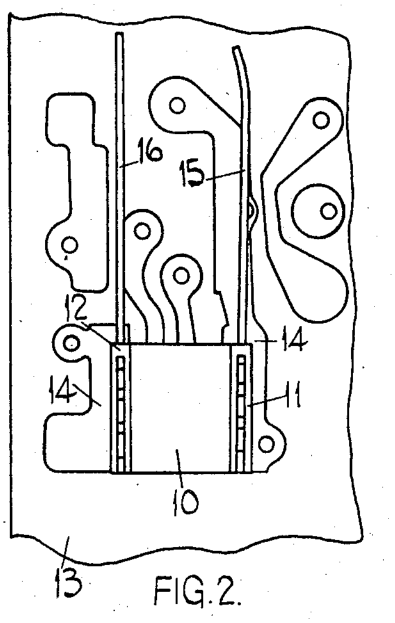
Figure 3:
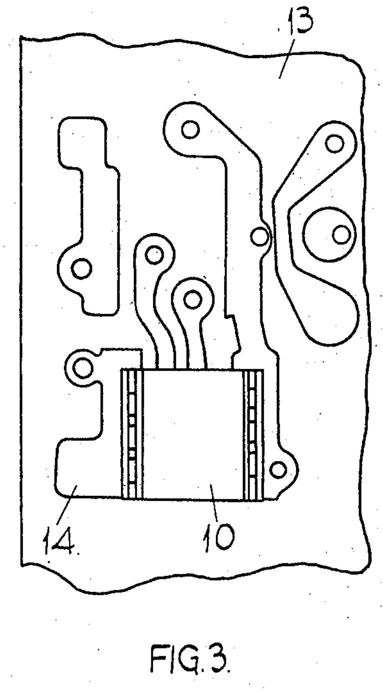
Figure 4:
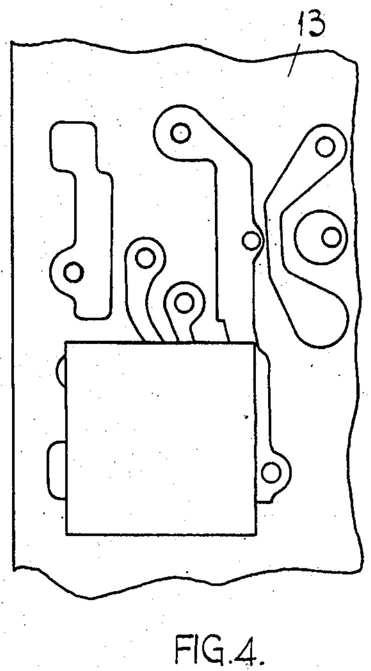

Two strips 15, 16 of metal foil are welded by electrical resistance welding at 17 to two of the areas 14 so that the strips are parallel and spaced by a distance less than the overall length of the component 10. A preferred welding method is that known as parallel-gap welding, in which two spaced electrodes are applied to the strips 15, 16. The strips 15, 16 may for example be formed of gold 0.010 inch wide × 0.003 inch thick or 0.005 inch wide and 0.002 inch thick. In this example, a quantity of epoxy resin adhesive is placed on the underside of the component 10 such that the component becomes adhered to the ceramic substrate 13 when placed in position upon the strips of foil 15, 16. The component 10 is then placed on the element with its metallised end on the strip 15, 16 where these are welded to the conductive areas 14. One end of each strip is then wrapped around the component and welded to the metallised area 11, 12 as shown in FIG. 2. Next, the other end of each strip is wrapped over the component and welded in place as shown in FIG. 3.

Finally the component is given a protective covering either by encapsulating it in a silicone rubber adhesive or, as shown, by attaching it to a cap, e.g., vinylidene fluoride, filled with a suitable adhesive, such as epoxy resin.

We claim:

1. A method of mounting, on thick film printed circuit elements, components having metallised contact areas, comprising welding a strip of metal foil to a conductive area of the circuit element, placing the component so that a metallised area of said component overlays the welded portion of said strip, wrapping the ends of the strip around the component and welding them to said metallised area on the component.

2. A method as claimed in claim 1 in which said strip is formed of gold foil.

3. A method as claimed in claim 1 in which a plurality of said strips are welded to respective conductive areas of said circuit element and to respective metallised areas of the component.

4. A method as claimed in claim 1 in which said welding is electrical resistance welding.

5. A method as claimed in claim 4 in which said welding is parallel-gap welding.

6. A method as claimed in claim 1 which includes the step of applying a layer of epoxy resin adhesive to that side of the component which is to be placed adjacent the conductive area.

7. A method as claimed in claim 1 which includes the step of encapsulating the component after the latter has been secured to the circuit element.

8. A method as claimed in claim 7 in which the component is encapsulated in silicone rubber.

9. A method as claimed in claim 8 in which the component is surrounded by a cap filled with a synthetic resin adhesive.

* * * * *